(12) United States Patent
Burton et al.

(10) Patent No.: US 10,941,482 B2
(45) Date of Patent: Mar. 9, 2021

(54) FILTER DEVICE TO REMOVE PARTICLES FROM A VAPOUR STREAM

(71) Applicant: TATA STEEL NEDERLAND TECHNOLOGY B.V., Velsen-Noord (NL)

(72) Inventors: Daniel Brian Burton, Haarlem (NL); Theodorus Franciscus Jozef Maalman, Uitgeest (NL); Edzo Zoestbergen, Alkmaar (NL); Colin Commandeur, Beverwijk (NL); Petrus Cornelis Jozef Beentjes, Castricum (NL)

(73) Assignee: TATA STEEL NEDERLAND TECHNOLOGY B.V., Velsen-Noord (NL)

( * ) Notice: Subject to any disclaimer, the term of this patent is extended or adjusted under 35 U.S.C. 154(b) by 316 days.

(21) Appl. No.: 15/537,275

(22) PCT Filed: Nov. 27, 2015

(86) PCT No.: PCT/EP2015/077925
§ 371 (c)(1),
(2) Date: Jun. 16, 2017

(87) PCT Pub. No.: WO2016/096377
PCT Pub. Date: Jun. 23, 2016

(65) Prior Publication Data
US 2017/0349999 A1    Dec. 7, 2017

(30) Foreign Application Priority Data

Dec. 19, 2014 (EP) .................................. 14020119
Jun. 12, 2015 (EP) .................................. 15020090

(51) Int. Cl.
| | |
|---|---|
| C23C 14/14 | (2006.01) |
| C23C 14/24 | (2006.01) |
| B01D 39/16 | (2006.01) |
| B01D 46/24 | (2006.01) |
| B01D 46/42 | (2006.01) |

(52) U.S. Cl.
CPC ............ *C23C 14/243* (2013.01); *B01D 39/16* (2013.01); *B01D 46/2403* (2013.01);
(Continued)

(58) Field of Classification Search
CPC ....... C23C 14/14; C23C 14/243; C23C 14/24; B01D 39/00; B01D 39/16; B01D 39/1669;
(Continued)

(56) References Cited

U.S. PATENT DOCUMENTS

| | | |
|---|---|---|
| 3,458,347 A | 7/1969 | Gimigliano et al. |
| 5,059,292 A | 10/1991 | Collins et al. |

(Continued)

FOREIGN PATENT DOCUMENTS

| | | | |
|---|---|---|---|
| JP | 59-172209 A | | 10/1983 |
| JP | 62-108517 | * | 5/1987 |

(Continued)

OTHER PUBLICATIONS

Machine translation JP 62-108517 (Year: 1987).*
(Continued)

*Primary Examiner* — Elizabeth A Burkhart
(74) *Attorney, Agent, or Firm* — Vorys, Sater, Seymour and Pease LLP

(57) ABSTRACT

A filter device for reducing the amount of non-vaporous components in a vapour stream, including a carbon foam as filter material capable of being penetrated by the vapour stream and arranged in such a way that the only route for the vapour stream to pass the carbon foam is via penetration of the carbon foam. The device is in particular suitable for (Continued)

coating a substrate by physical vapour deposition of the vapour. The homogenous and single phase vapour stream produced by the filter device results in a smooth coated substrate wherein splashes are virtually absent.

18 Claims, 11 Drawing Sheets

(52) U.S. Cl.
CPC .......... B01D 46/4263 (2013.01); C23C 14/14 (2013.01); *B01D 2239/0464* (2013.01)

(58) Field of Classification Search
CPC ........ B01D 39/2055; B01D 46/00–546; G02B 1/10
USPC .............. 118/610, 726, 715; 95/283; 96/242
See application file for complete search history.

(56) References Cited

U.S. PATENT DOCUMENTS

| | | | | |
|---|---|---|---|---|
| 6,238,464 B1* | 5/2001 | Dullien | ................. | B01D 45/02 55/304 |
| 6,444,043 B1* | 9/2002 | Gegenwart | ........... | C23C 14/243 118/726 |
| 7,708,794 B2* | 5/2010 | Dullien | .............. | B01D 39/1623 55/484 |
| 2009/0293807 A1 | 12/2009 | Liu et al. | | |
| 2012/0028408 A1 | 2/2012 | Baker et al. | | |
| 2014/0220296 A1* | 8/2014 | Loboda | ................. | C30B 23/005 428/131 |

FOREIGN PATENT DOCUMENTS

| | | |
|---|---|---|
| JP | 62-273234 A | 11/1987 |
| JP | 2001-183503 A | 7/2001 |
| JP | 2003165782 A | 6/2003 |
| JP | 2012-126936 A | 7/2012 |
| WO | 2009014398 A2 | 1/2009 |
| WO | 2012175128 A1 | 12/2012 |

OTHER PUBLICATIONS

International Search Report and Written Opinion dated Feb. 4, 2016 for PCT/EP2015/077925 to Tata Steel Nederland Technology B.V. filed Nov. 27, 2015.

* cited by examiner

FILTER DEVICE TO REMOVE PARTICLES FROM A VAPOUR STREAM

CROSS-REFERENCE TO RELATED APPLICATIONS

This is a § 371 National Stage application of International Application No. PCT/EP2015/077925 filed on Nov. 27, 2015, claiming the priority of European Patent Application No. 14020119.5 filed on Dec. 19, 2014 and European Patent Application No. 15020090.5 filed on Jun. 12, 2015.

FIELD OF THE INVENTION

The invention relates to a device for reducing the amount of non-vaporous components in a vapour stream, to a vapour generator comprising such device and to an apparatus for vapour deposition comprising such a vapour generator. The invention further relates to a method for depositing a vapour on a substrate and to a substrate obtainable by such method.

BACKGROUND OF THE INVENTION

In many industrial processes, matter is transported by guiding it through a confined space as a vapour stream. Due mainly from ejection from the melt, either by boiling or instabilities, or due to premature condensation of the vapour or due to incomplete evaporation of a liquid source, such streams may contain entrained liquid that is carried along by the vapour stream. Such entrained liquids often form a problem in the further processing of the vapour stream.

For example, droplets of liquid that are present in a vapour stream that is used in a physical vapour deposition (PVD) process may end up as splashes on the resulting coating, which would otherwise have a much higher smoothness. Such irregularities are undesired, because they reduce the quality of the coated product. Often, vapour deposition processes make use of a reservoir (crucible) of molten source material wherein the source material is heated to form the vapour stream. A problem associated with this technique is that during evaporation, splashes of liquid material are expelled from the melt and end up in the vapour stream. Many efforts have been made to reduce the formation of such splashes during evaporation or to remove them from the vapour stream. For example, it is known to use a carbon foam baffle that partially blocks the vapour duct, in the sense that the line of sight of droplets in the vapour stream is blocked. Such a baffle has the effect that droplets are trapped, and that they either evaporate into the stream or aggregate to return to the evaporating material, but may also transmit liquids if the flux is high enough to counteract gravity. It also has limitations where the splashes may solidify and therefore block the flow, leading to rupture of the baffle if the pressure difference on either side becomes too high.

However, none of such methods proved satisfactory in vapour deposition processes, especially not when high evaporation rates are desired (at high evaporation powers, the evaporation is more vigorous and results in more entrained liquid in the vapour stream). In the case of a carbon foam baffle partially blocking the vapour duct, the progressively higher production rates cause progressively larger droplets to pass either side of the baffle in the vapour stream.

SUMMARY OF THE INVENTION

It is therefore an objective of the present invention to provide a device for removing splashes from a vapour stream. It is in particular an objective that effective removal occurs at higher evaporation rates of the source material, for example at a rate of up to 500 g and more preferably up to 2000 g of source material per $m^2$ of melt per second.

It has now been found that one or more of these objects can be reached by applying a particular filter material in a particular arrangement in the vapour stream.

Accordingly, the present invention relates to a filter device (1) for reducing the amount of non-vaporous components in a vapour stream, comprising
an inlet passage (2) for a vapour stream (5);
means (6) for removing eventual non-vaporous components from the vapour stream (5);
an outlet passage (7) for releasing the vapour stream (5) from the filter device (1);
wherein the inlet passage (2) is in fluid communication with the means (6) for removing non-vaporous components; and wherein the means (6) for removing non-vaporous components is in fluid communication with the outlet passage (7);
characterized in that
the means (6) for removing non-vaporous components comprises a carbon foam component (8), which carbon foam component (8) is capable of being penetrated by the vapour stream (5) to allow passage thereof towards the outlet passage (7); and
the only route for the vapour stream to pass the means (6) for removing non-vaporous components is via penetration of the carbon foam component (8).

Optionally, a device of the invention comprises thermally insulating material to prevent condensation of vapour in the vapour stream.

In a device of the invention, the vapour must be forced to go through the carbon foam. Any arrangement wherein vapour passes through channels that do not have filtration capability will greatly reduce the effectiveness of the filter device. Firstly because when an open channel—having a low resistance to the flow—is present, most of the vapour will travel through that path, and secondly, any particles that have a low inertia will be carried along in the stream and not have a chance to contact the filter, irrespective of the line of sight. By the line of sight is meant the unobstructed trajectory of an entrained particle when flowing from the inlet passage through the outlet passage in a device. The term refers to known filter devices, wherein a free flow of vapour is allowed from the inlet passage to the outlet passage. In a device of the invention, however, there is no unobstructed trajectory from the inlet passage through the outlet passage, since all possible trajectories are obstructed by the carbon foam.

DETAILED DESCRIPTION

Figure 1:
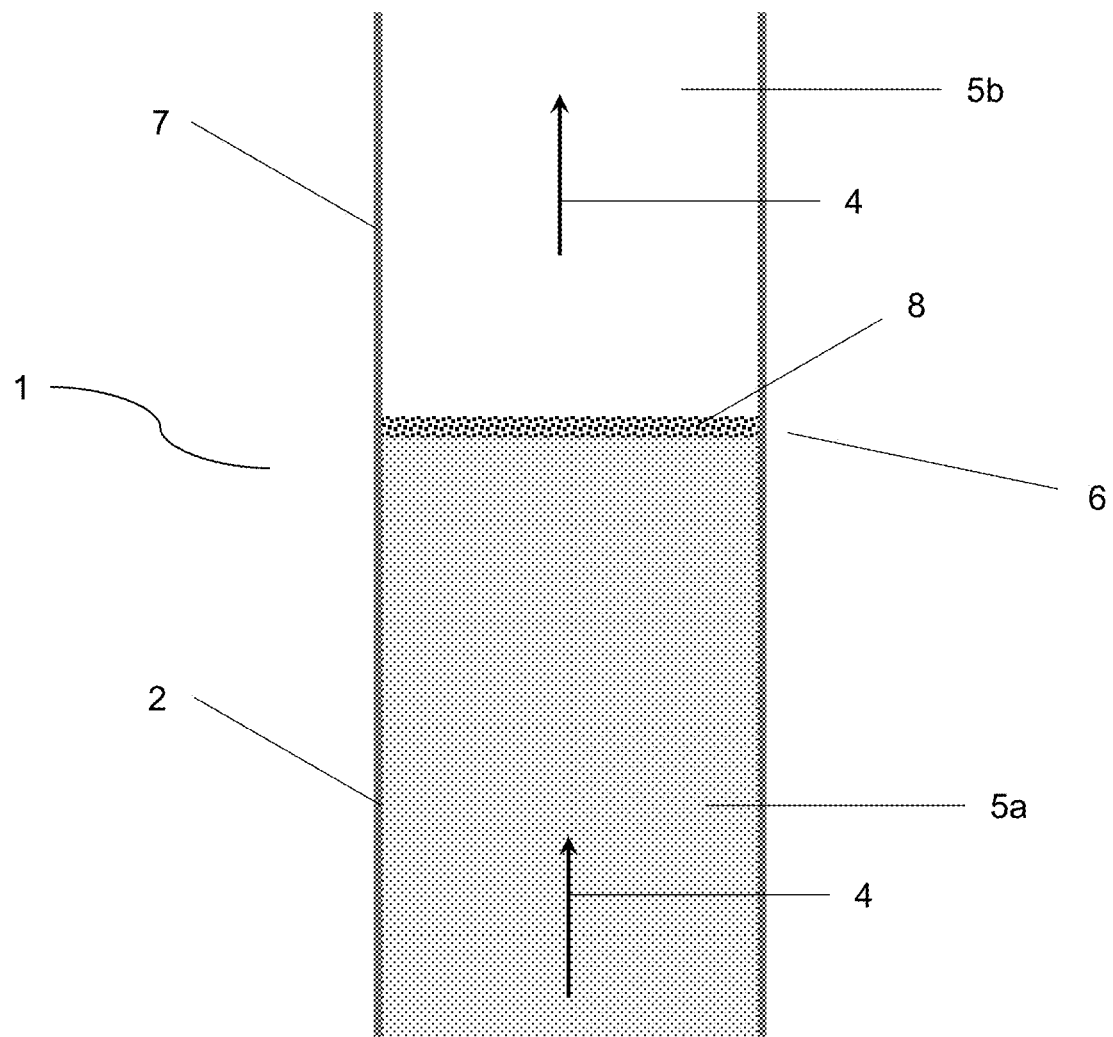
FIG. 1 is a cross-sectional view of a filter device (1) of the invention in the plane of the vapour stream.

Referring to the drawings, FIG. 1 is a cross-sectional view of a filter device (1) from the side in the plane of a vapour stream (5). The vapour stream (5) is divided in an incoming vapour stream (5a) and an exiting vapour stream (5b), both having a net flow in the direction (4). The filter device (1) has an inlet passage (2) for the incoming vapour stream (5a) comprising entrained liquid or other particles, which can be connected to the outlet of a crucible, a reactor, a tube, a pipe or any other element that is capable of guiding a vapour stream. The capability of the filter device (1) to filter entrained liquid or other particles from an incoming vapour stream (5a) relies on the means (6) for removing non-vaporous components and its particular arrangement in the inside of the filter device (1). Since no vapour flow can pass alongside the means (6), splashes present in the vapour stream will be put to a stop, while the vapour itself can indeed pass the means (6). Once passed, the vapour stream will be guided through a further filter device (1). The filter device (1) has an outlet passage (7) for releasing the filtered vapour stream (5b) from the filter device (1) into a further device wherein the vapour stream can be further processed.

The means (6) comprises a carbon foam material (8). This material puts splashes in the vapour stream to a stop, while the vapour itself can indeed pass the carbon foam material (8). After the blocking of the splashes at the foam, the captured splashes will either be evaporated or will accumulate and reflux back to the melt via gravity. This leads to a vapour stream (5b) exiting the filter device which is free of splashes, or which contains a reduced amount of splashes compared to the incoming vapour stream (5a) which has not yet passed carbon foam material (8). Thus, when arranged to receive a vapour stream that contains non-vaporous components such as entrained liquid or other particles, a filter device (1) of the invention effectively reduces the amount of such non-vaporous components in a vapour stream. It may also completely remove such components from the vapour stream.

The carbon foam material (8) should be robust, i.e. it should not mechanically erode and is chemically stable during operation. The exact specifications will depend on the particular application of the filter device. The skilled person will be able to find a carbon foam (8) with sufficient robustness by routine experimentation and without exerting inventive effort. For example, in the case that the source material is molten zinc and removal of zinc droplets from a zinc vapour stream is required, it appeared that a vitreous carbon foam is suitable, which has a thickness of 30 mm; a bulk density of 0.05 g cm$^{-3}$; a porosity of 96.5%; a mesh of 24 or 40 pores cm$^{-1}$ (depending on grade); and a temperature resistance of 3000° C. in vacuum or inert gas, or 500-600° C. in air. Vitreous or glassy carbon is a form of pure carbon produced by the thermal decomposition of a three-dimensionally cross linked polymer.

In general, the carbon foam is a material with an open cell structure, having a mesh of between 10 and 100 pores cm$^{-1}$. Preferably, the mesh is in the range of 20 and 50 pores cm$^{-1}$.

In some cases, it is preferred that the carbon foam exhibits a varying cross-sectional thickness in the direction of the vapour flow. This would lead to lower restriction of velocity at the thinner regions, thereby promoting the separation of liquid particles according to size, whereby the smaller particles, with lower inertia, are carried towards the thinner sections, but the larger particles travel more according to their momentum as they leave the melt. In this manner, the burden of the evaporating is spread over a larger area than would otherwise be the case.

The filter can be further optimised by installing the foam at the location having the duct with the largest cross-sectional area. In this way, the largest possible area is available to intercept the non-vaporous particles with the lowest drop of pressure.

A further embodiment according to the invention provides a grading system of carbon foams, where the first foam that comes into contact with the vapour and droplet mix is coarse and has a thicker structure. This has the effect that the larger droplets are removed at this stage, while the smaller droplets pass through. It will also have a greater heat capacity and be less affected by temperature loss caused by the evaporation of larger particles.

A filter device of the invention is in particular suitable for providing a vapour stream for PVD. The outlet passage (7) may therefore in particular be connected to a PVD-unit. It has been found that such combination allows high quality, full finish PVD-coated materials to be made. For PVD, a vapour stream is usually a stream of metal vapour (e.g. zinc vapour, magnesium vapour, titanium vapour, chromium vapour, manganese vapour, nickel vapour, bismuth vapour, strontium vapour, antimony vapour and aluminum vapour), but may also be a stream of vapour of a metal salt (e.g. a metal nitride such as titanium nitride, zirconium nitride, chromium nitride and titanium aluminum nitride).

In a preferred embodiment, the means (6) for removing non-vaporous components comprises a graphite component (9) adhering to the carbon foam component (8), which is capable of being heated by electromagnetic induction and of conducting the heat to the carbon foam component (8), the filter device further comprising an induction coil (10) located around the graphite component (9). The graphite component (9) may partly or completely surround the carbon foam component. In contrast to the carbon foam, the graphite is not porous but dense. The heat capacity of the graphite is therefore much higher than that of the foam.

In this embodiment, the carbon foam can be actively and externally heated by means of electromagnetic induction and/or optionally also by resistance heating. The carbon foam may be heated directly as a result of electromagnetic induction in the foam (caused by an electric alternating current through the induction coil), but the effect is generally too small to provide enough energy for continued evaporation of captured particles. It may also be heated indirectly by thermal conduction via the graphite component (9), in this manner, substantially more energy can be provided to evaporate captured particles than by the foam alone. The heating of this graphite component (9) may be performed by electromagnetic induction caused by an electric current through the induction coils and/or by conduction of heat from a heating device located at or near the graphite component (9), for example but not limited to energy provided by electrical resistance, friction, magnetron, plasma or electron beam devices.

The graphite component (9) should have sufficient surface area in contact with the carbon foam material (8). In this way, the thermal energy can be effectively conducted between the two.

In order to achieve the most effective heating of the carbon foam with the induction coils (10), they are usually adhered to a volume that contains the graphite component (9), and usually also to a volume that contains the carbon foam component (8). The generator for the induction current in the coils must be suited to the graphite component and the shape thereof, allowing that adequate heating can be provided. A person skilled in the art is capable of making such arrangement, and of determining the optimal frequency, current and voltage during operation of the filter, by routine experimentation and without exerting inventive effort.

Heating of the carbon foam promotes evaporation of splashes that have been formed during the evaporation from the bulk liquid or solid, or by accidental condensation of vapour. Such heating is especially important since carbon foam material has a very small heat capacity. Due to its highly porous nature, it will rapidly lose heat when impacted by a splash, and its temperature may easily fall below the dew point temperature of the vapour. An area that has provided the heat for evaporating the splash will become ineffective for future evaporation until the temperature is again significantly above the vapour dew point temperature. With the auxiliary heating, this time is significantly reduced. Preferably, the heated carbon foam also superheats the vapour passing through it, reducing the likelihood of vapour condensation further downstream. As the vapour flux increases, so will the effect it has on cooling the foam as the vapour passes through, and therefore as progressively higher vapour fluxes are evolved, so the energy supplied to the coils is increased to maintain the evaporating effect of the filter.

A super-heated plasma in the vicinity of the carbon foam filter may also enhance the evaporating effect if it is of sufficiently high temperature. In this way, the filtration media can be heated effectively by radiation. For example, the plasma typically has a temperature of >1500K when a vapour stream of liquid zinc is processed. A thermionic emission source, such as graphite, might also be used to heat the carbon foam.

Due to the set-up wherein the graphite material can be heated by induction and is connected to the graphite foam, it is an advantage of a device of the invention that the vapour passing through the carbon foam can easily be superheated. This is beneficial because this reduces the likelihood of undesired vapour condensation further downstream.

Figure 2:
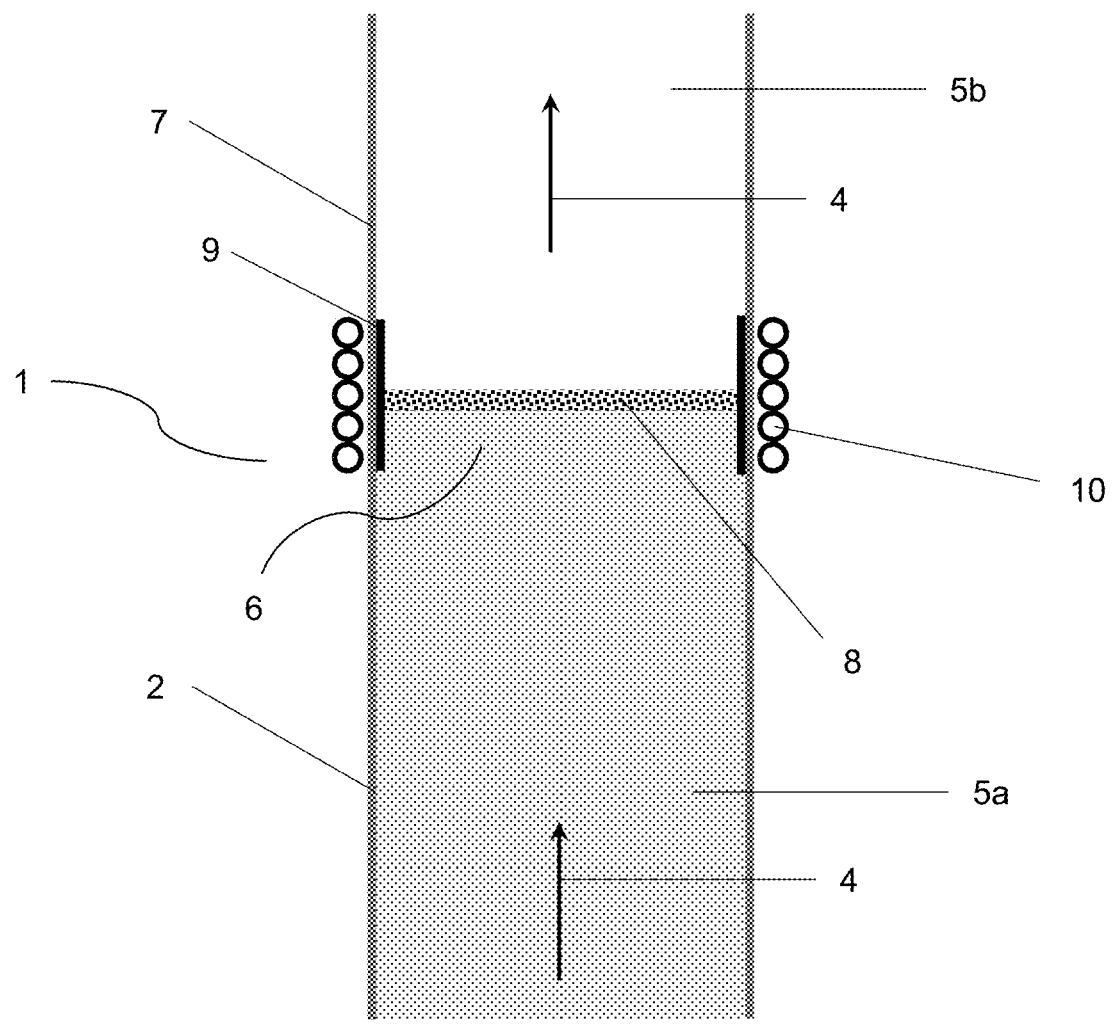
FIG. 2 is a cross-sectional view of a filter device (1) of the invention in the plane of the vapour stream, comprising a graphite tube surrounding and adhering to a carbon foam component.

In a particular embodiment as illustrated in FIG. 2, the graphite component (9) is a graphite tube enclosing the carbon foam component (8). The carbon foam component (8) then in principle has a disc-like shape that fits into the tube and blocks any line of sight in the tube. Such tube has a particular length and a particular circular inner diameter; the length and the inner diameter may have a ratio in the range of 1:5 to 5:1, preferably in the range of 1:5 to 1:1. The tube itself, when filled with the carbon foam, may therefore also have a disc-like appearance (likely when the ratio is in the range of 1:5 to 1:1). Accordingly, FIG. 2 represents the cross-section of a cylinder, wherein its longitudinal central axis is in the plane of the figure.

A graphite tube around, or in intimate contact with a carbon foam component (8) appears to be an effective way to increase the conduction of thermal energy between the graphite component and the carbon foam. In the example shown in FIG. 2 the outer edges will be heated more effectively by the graphite than the central part of the carbon foam component (8).

Figure 3:
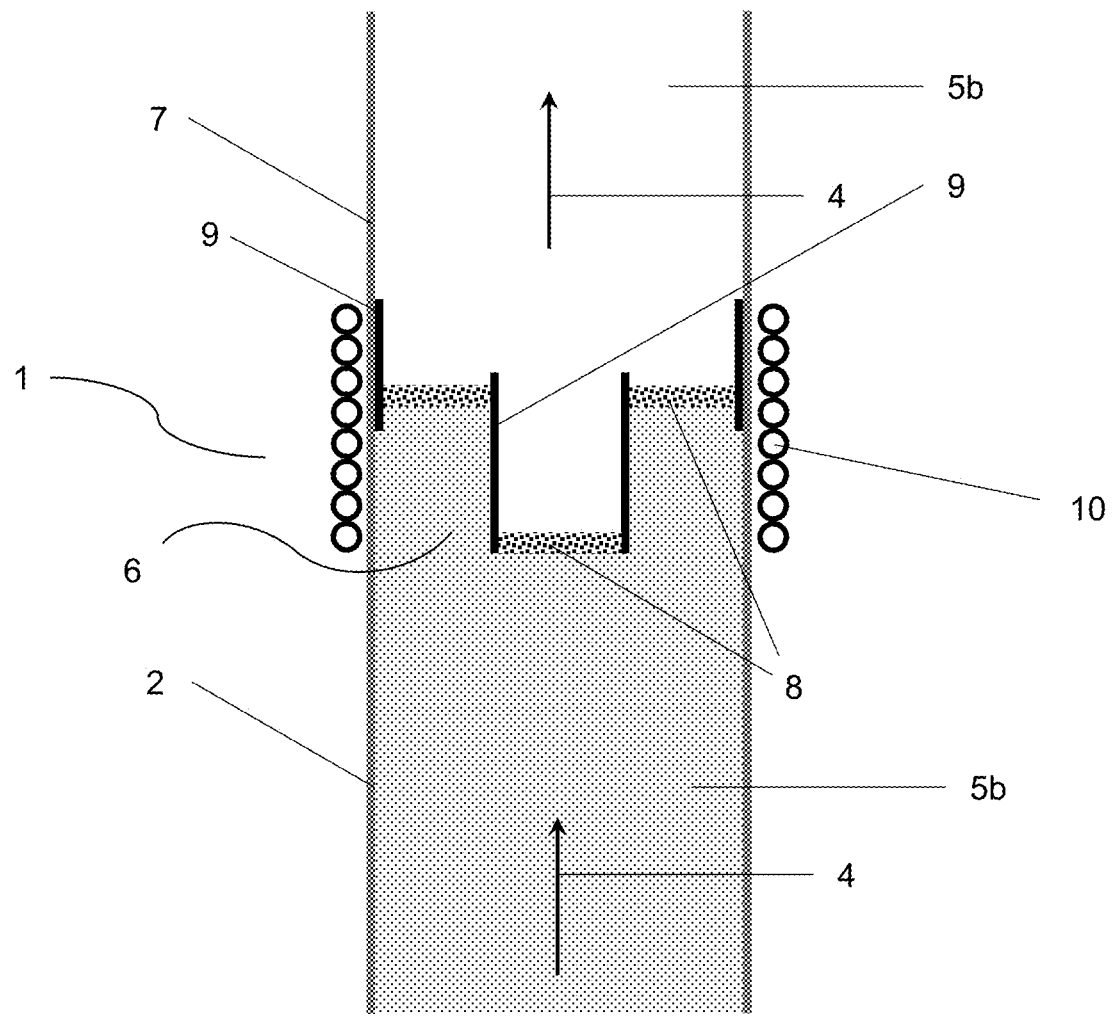
FIG. 3 is a cross-sectional view of a filter device (1) of the invention in the plane of the vapour stream, comprising an inner and an outer graphite tube, each enclosing a carbon foam component.

In another particular embodiment, as illustrated in FIG. 3, the means (6) for removing non-vaporous components comprises a first graphite tube of a first diameter and a second graphite tube of a second diameter that is smaller than the first diameter, wherein the first graphite tube encloses a first carbon foam component;
the second graphite tube encloses a second carbon foam component;
the first carbon foam component is connected to the second graphite tube such that the longitudinal central axes of both tubes are substantially in the same direction.

Thus, the means (6) comprises an outer graphite tube tightly enclosing a first disc-like carbon foam component and an inner graphite tube that narrowly encloses a second disc-like carbon foam component. For the connection of both tubes, the first disc-like carbon foam component preferably has a circular hole in which the inner graphite tube is fit. Preferably, the longitudinal central axes of both tubes deviate less than 20°, preferably deviate less than 15°, more preferably deviate less than 10° and even more preferably less than 5°. Most preferably, both axes are substantially parallel. In addition, it is preferred that both axes substantially coincide, i.e. the inner tube has an equal spacing with the outer tube around the entire circumference.

In another particular embodiment, the means (6) for removing non-vaporous components comprises a structure of graphite components (9) and carbon foam components (8) in an alternating fashion. Thus, the means (6) may be a structure of a plurality of graphite components and a plurality of carbon foam components, wherein the graphite components and carbon foam components are present in an alternating fashion.

The advantage of such structure is that heat that is withdrawn from the foam for the evaporation an impacted splash, can quickly be supplied by thermal conduction. It has been found that this would otherwise take more time due to the small heat capacity of the carbon foam material and the slow heat transfer through the material. The layers of carbon foam should be sufficiently thin to ensure that they maintain a high temperature by sufficient conduction of heat from the layers of graphite. The thickness of a layer of carbon foam between two layers of graphite components depends on factors such as the thickness of the graphite components, the actual thermal conductivity of the particular carbon foam, the amount of electromagnetic induction taking place in the foam (reducing the amount of heat that is required via thermal conduction), and the amount of entrained liquid that is to be evaporated per volume of filter material per unit of time. In a device of the invention, the thickness of a layer of carbon foam is for example in the range of 0.4-10 cm.

The alternating graphite components should have sufficient surface area in contact with the foam such that the thermal energy can be effectively conducted between the two. For example, the distance on a carbon foam component in the direction of the vapour stream that is covered by a graphite component may relate to the thickness of the carbon foam perpendicular to the direction of the vapour stream in a ratio in the range 1:4 to 4:1, in particular in the range of 1:2 to 2:1.

The alternating graphite components are heated by induction heating of the coil. In this particular embodiment, the alternating graphite components and the means for heating them are designed in such a way that the alternating graphite components can be maintained at temperatures significantly higher than the melt and the vapour dew point temperature.

Figure 4:
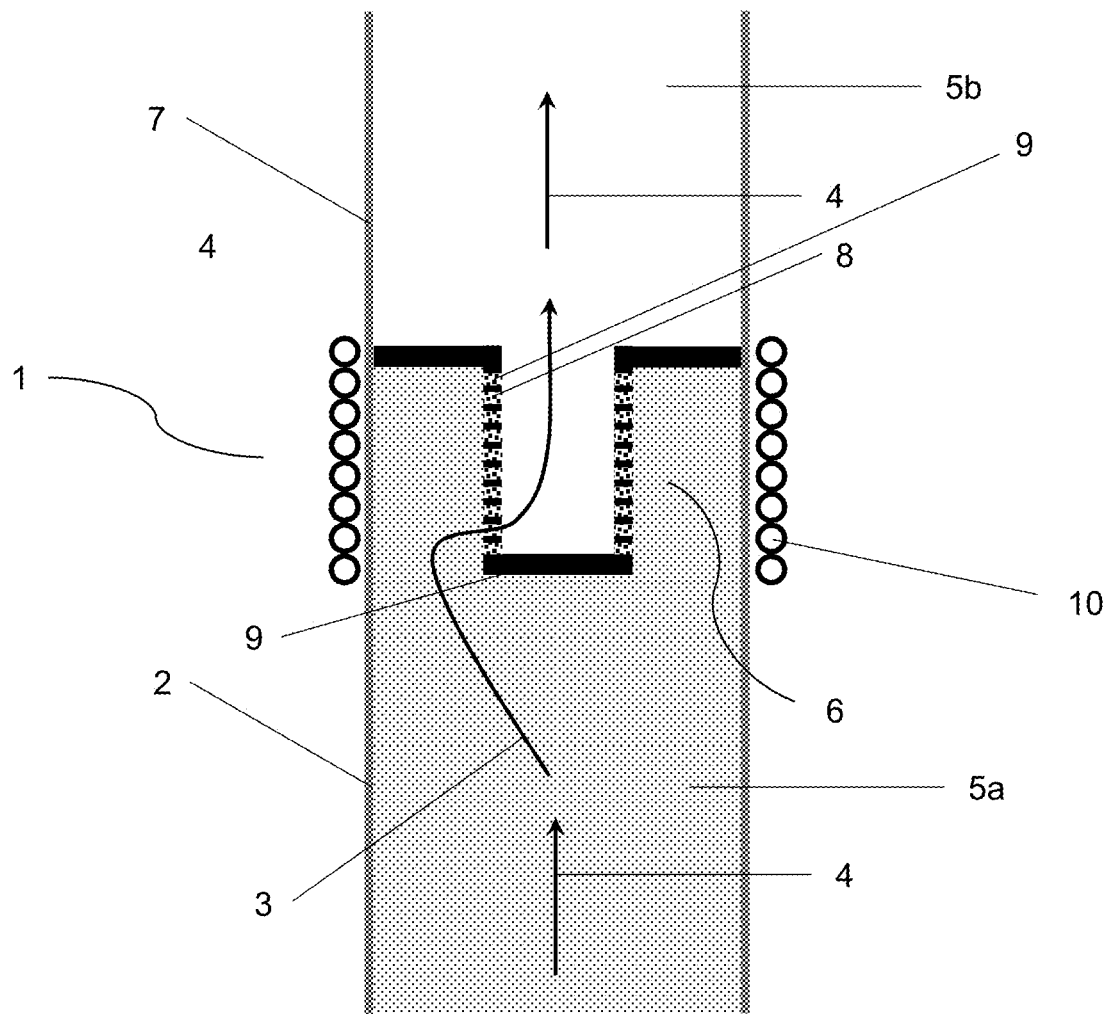
FIG. 4 is a cross-sectional view of a filter device (1) of the invention in the plane of the vapour stream, comprising a structure of graphite components and carbon foam components in an alternating fashion.

In particular, the alternating components are ring-shaped and together form a layered structure of a tubular shape, which extends substantially parallel to the direction of the vapour stream (5). This is illustrated in FIG. 4. The trajectory of one path the vapour stream may take is represented by stream (3).

Figure 5:
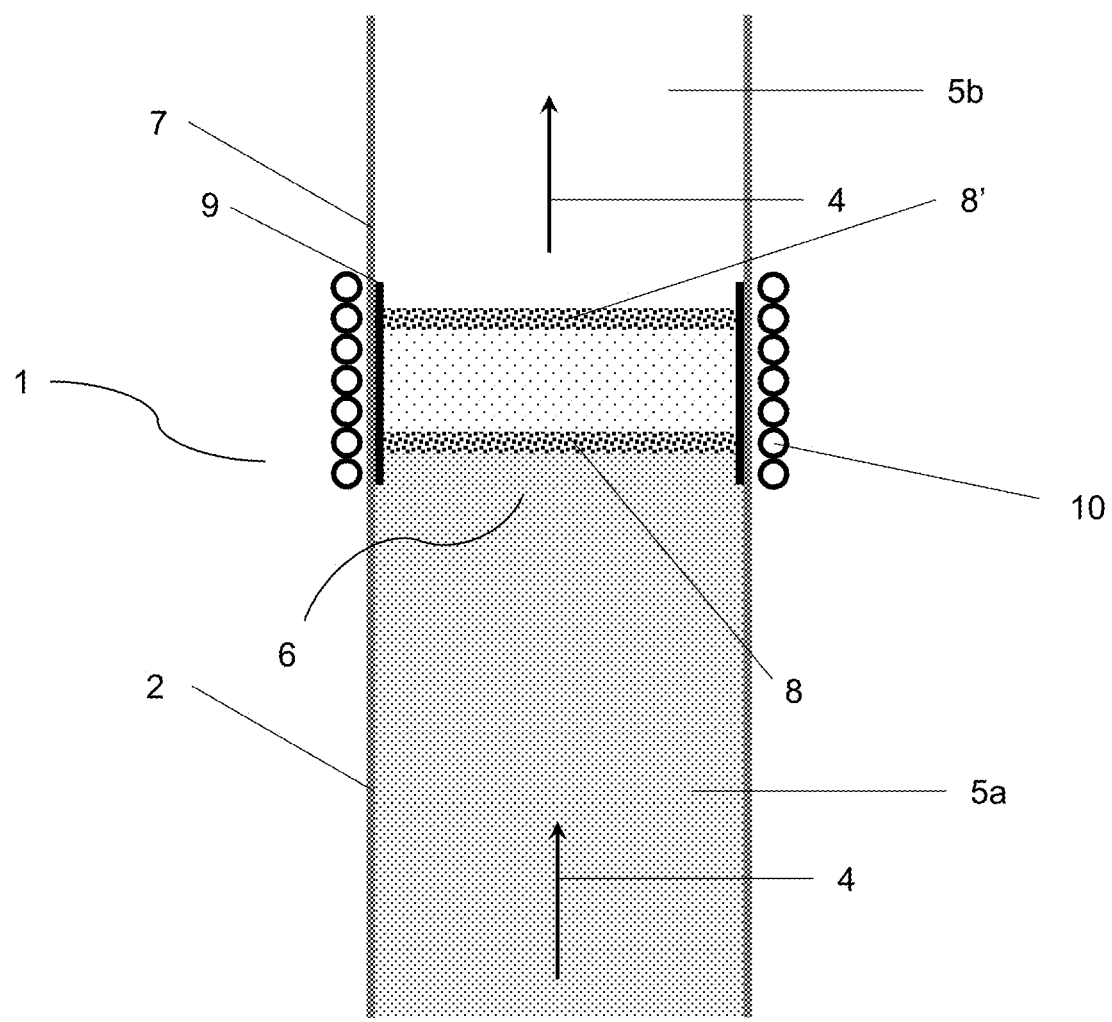
FIG. 5 is a cross-sectional view of a filter device (1) of the invention in the plane of the vapour stream, comprising two carbon foam filters in series, surrounded by one single graphite tube.
Figure 6:
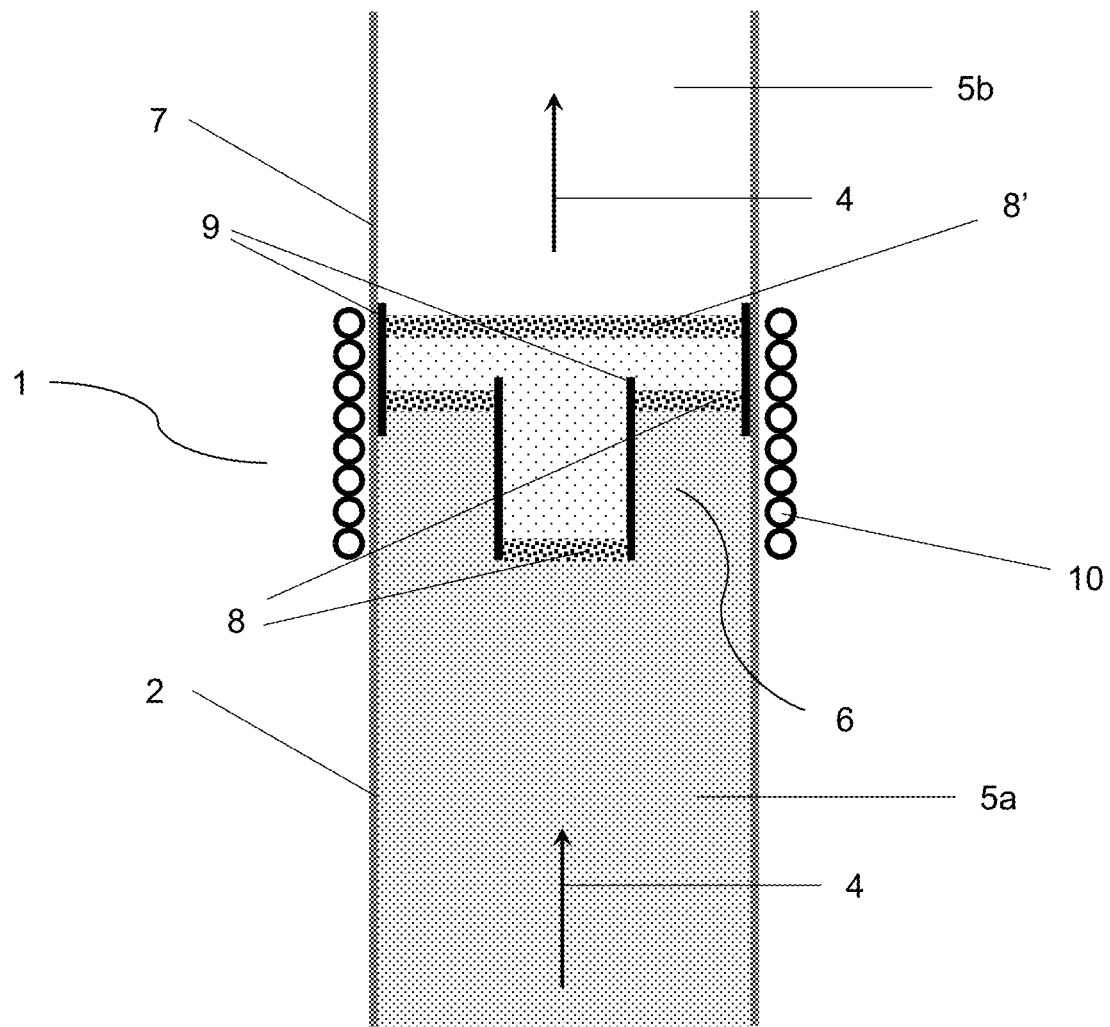
FIG. 6 is a cross-sectional view of a filter device (1) of the invention in the plane of the vapour stream, comprising two carbon foam filters in series and having an inner and an outer graphite tube.

In another embodiment, the means (6) in the device comprises a further carbon foam component (8'), which is in series and in fluid communication with carbon foam component (8), component (8) and component (8') preferably being placed such that the vapour stream (5) first penetrates component (8) and thereafter component (8'). This is illustrated in FIGS. 5 and 6. In the event that non-vaporous components are not trapped by the first filter line (component (8)), they will meet the second filter line (component (8')) that likely traps and removes them in the second instance. Just as the carbon foam component (8), also the further carbon foam component (8') should not leave room for the vapour stream to pass aside it. To this end, the component (8') may completely cover the cross-sectional area of the filter device.

When making a series of two or more layers of carbon foam, it may be beneficial to employ layers that have a progressively finer structure in the direction of the vapour flow, and thinner pore sizes and a larger cross-sectional surface area. This will reduce the burden on the fine foam, which will be susceptible to blocking. By placing filters in series, complete removal for a given droplet and particle size distribution can be achieved. Likewise, a plurality of filters based on the carbon foam can be positioned in parallel in a filter device. This may be beneficial when geometry factors prevent a series system from working properly, which may be encountered under increased vapour production conditions.

The cross-sectional surface area of the finer foam filters must be sufficiently large to accommodate any loss in vapour flux caused by their presence. Or they must be sufficiently thin so as to minimize pressure loss.

In any of the embodiments wherein a graphite component (9) is present, it is adhering to the carbon foam component (8). A good adherence ensures that the graphite component (9) is in intimate contact with the carbon foam component (8). This is important since it allows a good conduction of thermal energy between both components. The graphite component (9) is usually fused to the carbon foam component (8) by an adhesive. Besides providing sufficient adherence, such adhesive should also be sufficiently thermally conducting and be in intimate contact with the graphite component (9) as well as the carbon foam component (8). In this way, the thermal conduction between both components may be further improved. The adhesive may for instance be a graphite adhesive or a ceramic adhesive, such as Resbond 931C graphite adhesive by Cotronics Corp and Resbond 904 zirconia adhesive, respectively.

So, a filter device of the invention permits the upstream development of splashes, and removes them from the vapour stream. The removal is so effective, that also higher amounts of splashes in the vapour stream can be coped with. This allows higher evaporation rates in an upstream vaporization container (e.g. a crucible), since higher evaporation rates usually lead to a more vigorous evaporation and the expulsion of liquid fragments (splashes) from the melt. It has been found that a device of the invention can effectively remove splashes from a vapour stream where the upstream evaporation rate is up to 2000 $g/m^2/s$, i.e. up to 2000 grams of evaporated matter per $m^2$ of surface of the melt per second. This surpasses the evaporation rates of known devices. For example, the device of U.S. Pat. No. 3,458,347 is stated to be able to cope with an evaporation rate of up to 80 $lb/ft^2/hr$. This corresponds to 108 $g/m^2/s$, which is almost a magnitude lower than the rates allowed by a device of the invention.

A filter device of the invention can in principle be used in any vapour stream that comprises non-vaporous components. As set out above, it is preferably used to treat streams of metal vapour. It can for example also be used in a stream of steam that carries droplets of condensed water with it. Such droplets can effectively be removed from the steam by the device. Another example is a vapour stream of an organic compound in a chemical process.

Preferably, in any use of a device of the invention, the vapour stream does not contain particles that cannot be evaporated by the filter, i.e. particles that do not evaporate at a combination of pressure and temperature that is compatible with the filter device and the vapour stream. When the vapour stream contains particles that cannot be evaporated by the filter, the foam in the device may be blocked by the particles, so that the vapour stream cannot pass the filter anymore.

Depending on the nature of the vapour stream, its treatment may be restricted to a certain range of temperatures and pressures. These ranges not only define the conditions at which a vapour is present, but also whether chemical reactions occur within the vapour stream. For example, at a certain combination of temperature and pressure, a compound in the vapour stream may degrade thermally or react with another compound or with itself (as e.g. a disproportionation reaction). Apart from the fact that such reactions are usually undesired in a chemical process, the reaction products are often solid particles, which may clog the carbon foam filter material.

In addition, there must also be no chemical reactions between the mobile phase (i.e. vapour stream and eventual non-vaporous components) and the means for filtration (in particular the carbon foam material), since this may also lead to undesired degradation of the components of the vapour stream and deterioration and/or blocking of the means for filtration.

Being aware of the necessity that such unnecessary side reactions should be avoided, the skilled person can identify the limits of the process conditions for a given vapour stream composition without undue experimentation and without exerting inventive effort.

A filter device of the invention may in particular be used in combination with a unit wherein the source material is evaporated. Therefore, the invention also relates to a vapour generator (11), comprising a vaporization container (12) for source material (13);
means (14) for heating the source material (13) to a temperature at which the source material (13) evaporates and forms a vapour stream (5);

a filter device (1);
an outlet passage (15);
wherein the vaporization container (12) is in fluid communication with the filter device (1); and wherein the filter device (1) is in fluid communication with the outlet passage (15) of the vapour generator (11).

Figure 7:
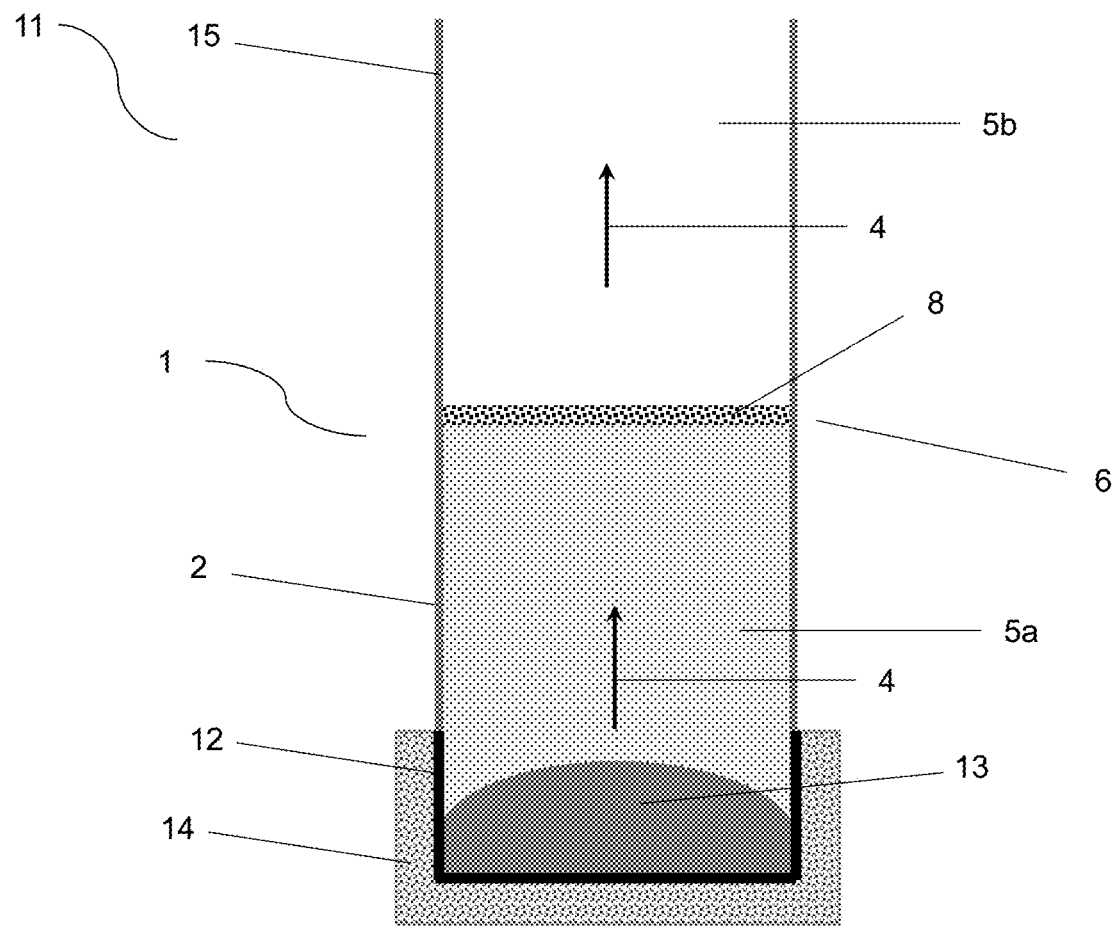
FIG. 7 is a cross-sectional view of a vapour generator (11) of the invention in the plane of the vapour stream, comprising the filter device shown in FIG. 1.

FIG. 7 displays a vapour generator (11) that is based on the filter device (1) as shown in FIG. 1. In the embodiment of FIG. 7, the vapour generator (11) comprises a filter device (1) having an inlet passage (2) for a vapour stream (5), wherein a vaporization container (12) is connected to the inlet passage (2). The vaporization container (12) can contain the source material (13) and comprises means (14) for heating the source material (13) or the container and the source material (13). In this way, the source material can be evaporated to produce the vapour stream (5). During operation, the generated vapour stream (5a) is guided though the filter device (1) and exits the vapour generator (11) as the filtered vapour stream (5b) through outlet passage (15). The filter device (1) of FIG. 7 comprises means (6) for removing non-vaporous components from the vapour stream (5). The means (6) comprises a carbon foam component (8).

Figure 8:
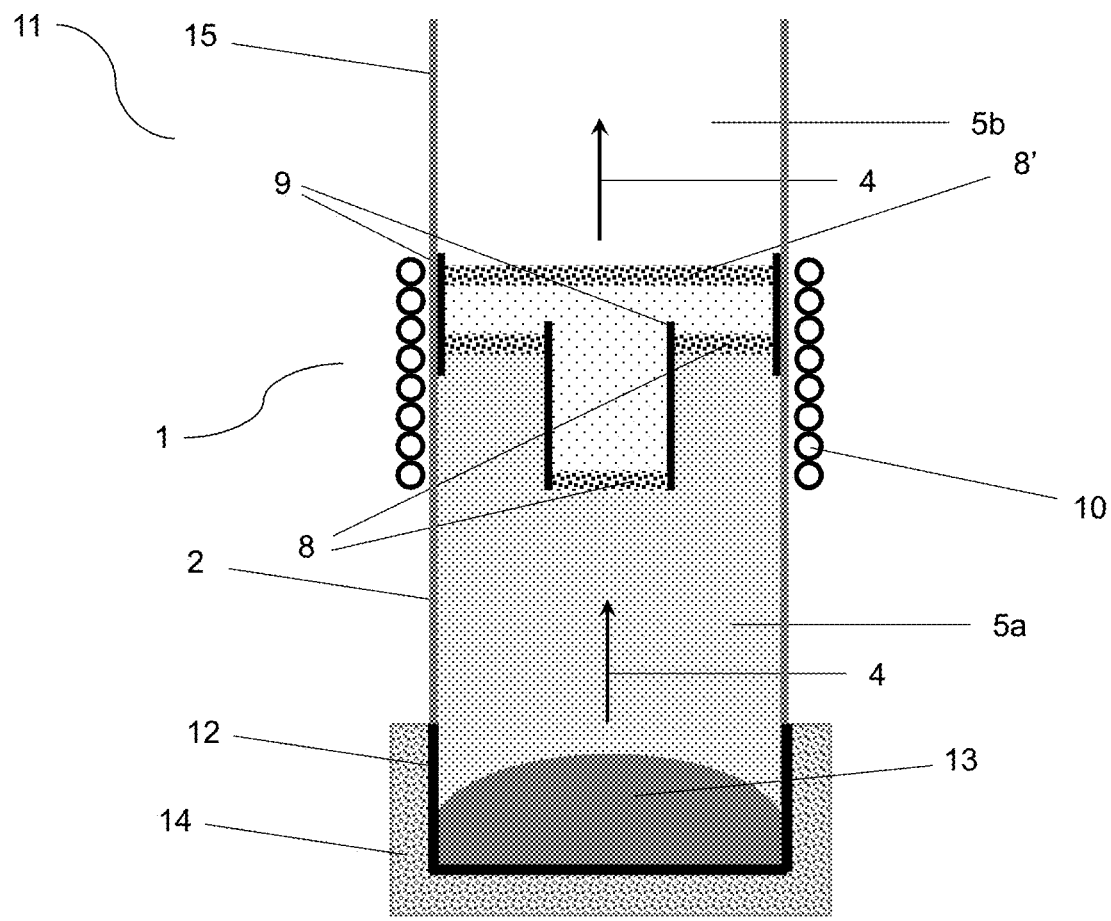
FIG. 8 is a cross-sectional view of a vapour generator (11) of the invention in the plane of the vapour stream, comprising the filter device shown in FIG. 6.

A vapour generator (11) of the invention may in principle comprise any type of filter device. In particular, it comprises a filter device (1) wherein a graphite component (9) adheres to the carbon foam component (8), wherein the graphite component (9) is capable of being heated by electromagnetic induction and of conducting the heat to the carbon foam component (8). Such filter devices are e.g. shown in any of FIGS. 2-6. FIG. 8, for example, displays a vapour generator (11) comprising the filter device shown in FIG. 6. Herein, the means (6) comprises a further carbon foam component (8'), which is in series and in fluid communication with carbon foam component (8). In this embodiment, component (8) and component (8') are preferably being placed such that the vapour stream (5) first penetrates component (8) and thereafter component (8').

A vapour generator (11) of the invention may operate under reduced pressure, for instance when used in a PVD set-up. The pressure may be reduced by a vacuum pump that is in fluid communication with the vapour stream (5), preferably with vapour stream (5b) because then there is no entrained liquid in the vapour that is sucked into the pump.

A filtration device of the invention can be employed directly after the melt area (as is indicated in FIGS. 7 and 8), but may also be placed further downstream. It may for example be included after the nozzles which are incident to the substrate, or along conductance channels. In some circumstances, it may be beneficial to employ the filter device close to the place where the vapour is further processed.

A vapour generator (11) benefits from the high performance of the filter device. Once splashes are ejected from the melt in the evaporation container, they are carried along in the vapour stream or as a projectile, until they are intercepted by the heated foam, which is at a much higher temperature than the droplet. This causes the splashes to evaporate, thereby eliminating them from the vapour stream, and producing a homogenous, single phase vapour stream for use in applications wherein entrained liquid in a vapour stream is undesired.

The invention is in particular useful in a process for physical vapour deposition (PVD). For this purpose, a filter device of the invention may be connected to 1) a unit wherein the source material is evaporated and 2) a unit that can receive a substrate to which the vapour can be deposited. Accordingly, the invention further relates to an apparatus for vapour deposition (21) on a substrate, comprising:

a vapour generator (11) as described above; and
means to pass the substrate over the outlet passage (15) of the vapour generator (11).

Figure 9:
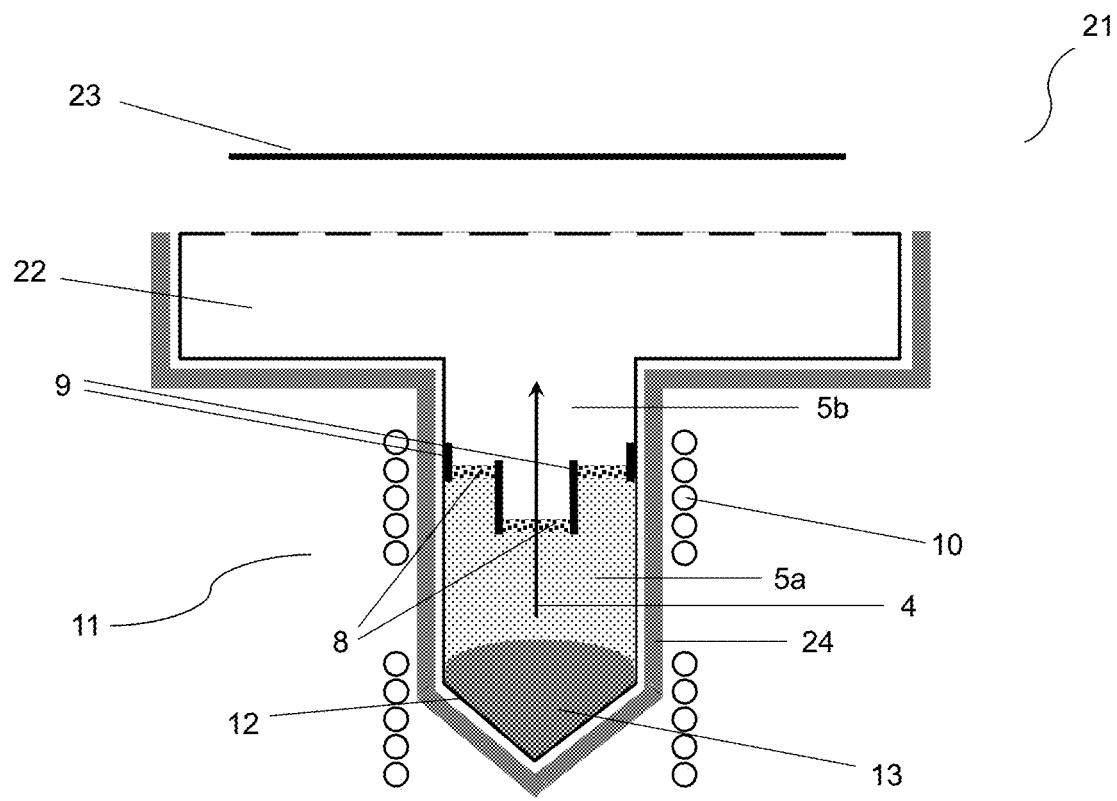
FIG. 9 is a cross-sectional view of an apparatus for vapour deposition (21) according to the invention, comprising the filter device as shown in FIG. 3.

FIG. 9 is a cross-sectional view of an apparatus for vapour deposition (21) according to the invention, which cross-section is in line with the net flow of the vapour stream in the apparatus. In this embodiment, a vapour generator (11) is connected to a vapour distribution box (VDB) (22) and is in fluid communication therewith. The vapour generator (11) contains a vaporization container (12) which is designed to comprise the (molten) source material (13). The vaporization container (12) is in fluid communication with carbon foam components (8) through which vapour stream (5a) penetrates. Once the vapour has passed, the filtered vapour stream (5b) is guided through a VDB (22). After exiting the VDB (22), the vapour stream (5b) meets substrate (23) and is deposited thereto. This method of coating the substrate is a method of physical vapour deposition. The carbon foam components (8) are held in place and surrounded by graphite components (9). Induction coils (10) are wound around the graphite components (9) as well as the vaporization container (12). In this way, both parts can be heated by means of electromagnetic induction. Heating of the vaporization container (12) results in evaporation of the source material to form the vapour stream (5a) as a net flow in the direction (4). Heating of the graphite components (9) results in heat conduction to the carbon foam components (8). The heated carbon foam components (8) are then effective in removing non-vaporous components (particles of entrained liquid) in the vapour stream (5a) at high flow rates. To suppress premature condensation in the apparatus (21), the walls of the apparatus are provided with insulating material (24), in particular with ceramic insulating material.

Figure 10:
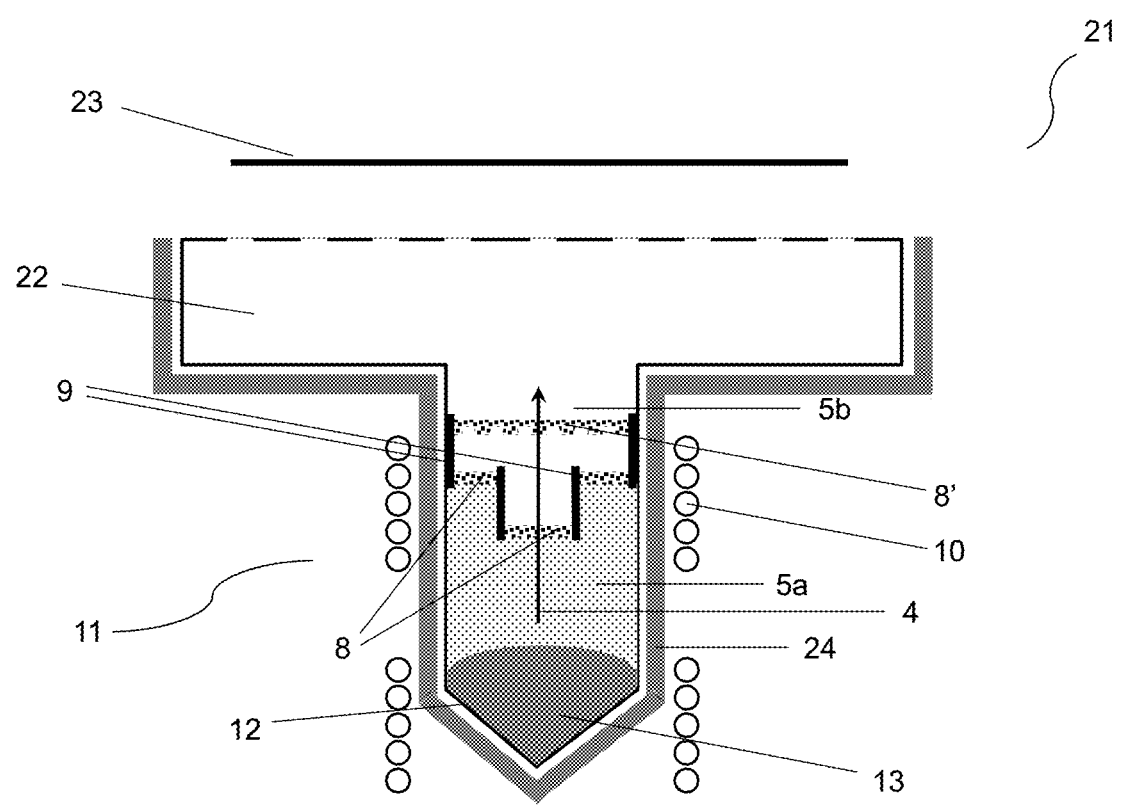
FIG. 10 is a cross-sectional view of an apparatus for vapour deposition (21) according to the invention, comprising the filter device as shown in FIG. 6.

FIG. 10 is another embodiment of an apparatus for vapour deposition (21) according to the invention. The filter device (11) comprises a further carbon foam component (8'), which is in series and in fluid communication with carbon foam component (8). Component (8) and component (8') are preferably being placed such that the vapour stream (5) first penetrates component (8) and thereafter component (8'). In the event that non-vaporous components are not trapped by the first filter line (component (8)), they will meet the second filter line (component (8')) that likely traps and removes them in the second instance. This design has proven particularly effective in removing non-vaporous components in the vapour stream (5a) at high flow rates.

The further carbon foam component (8') in FIG. 10 has a varying cross-sectional thickness in the direction of the vapour flow. As described above, this improves the efficiency of the filter device, see also FIG. 11 and the Examples.

The invention further relates to a method for depositing a vapour on a substrate to form a coating, comprising:
providing an apparatus for vapour deposition (21) as described hereinabove; then
placing a source material (13) in the vaporization container (12); then
activating the means (14) for heating the source material (13) to thereby form a vapour stream; and activating the induction coil (10) around the graphite component (9), if present; then
passing the vapour stream (5) through the carbon foam component (8) of the means (6) for removing non-vaporous components to form a vapour stream (5) substantially free of non-vaporous components; then releasing the vapour stream (5) through outlet passage (15) and spraying it onto the substrate to form the coating.

In a preferred embodiment, the source material (13) comprises a metal, e.g. a metal such as zinc, magnesium, titanium, chromium, manganese, nickel, bismuth, strontium, antimony and aluminum. It may also comprise a metal salt, e.g. a metal nitride selected from the group of titanium nitride, zirconium nitride, chromium nitride and titanium aluminum nitride.

In another preferred embodiment, the method is carried out with a reduced pressure in the vapour generator. By a reduced pressure is meant of pressure below atmospheric at 760 Torr, that is a low vacuum of between 760-25 Torr, a medium vacuum of between $25\text{-}1\times10^{-3}$ Torr and a high vacuum of between $1\times10^{-3}\text{-}1\times10^{-6}$ Torr.

The invention further relates to a coated substrate obtainable by a method described hereinabove.

The invention further relates to the use of a carbon foam component in a filter device to reduce the number of splashes formed during depositing a vapour on a substrate.

EXAMPLES

Methods and Materials:

The invention is demonstrated by performing PVD of zinc vapour onto a substrate, making use of PVD-apparatuses comprising different vapour generators. The reduction of the formation of splashes on the coated substrate as compared to conventional vapour generators was measured. The different vapour generators used to demonstrate the invention are the following and their filter devices differ in the following way:

1. "Control"

Here there are no methods employed for the reduction of splashes, nor are there efforts to prevent secondary condensation from occurring.

2. "Condensation Suppression"

The means for preventing condensation droplets from forming by super-heating the internal surfaces comprises a graphite tube heated by induction.

3. "Partial Baffle" (a Filter Device of the Invention).

The means for removing liquid or solid components comprises a baffle partially blocking the vapour duct to catch and trap ejected droplets, and give them time and energy to evaporate or coagulate and be returned to the evaporating material. This operates by blocking the line of sight of liquid or solid components.

4. "Foam Combination System" (a Filter Device of the Invention)

The means (8) (as in FIG. 9), for removing non-vaporous components comprises two graphite tubes, an inner and an outer tube. Each encloses a carbon foam component.

5. "Foam Combination System and Baffle" (a Filter Device of the Invention)

The means (6) for removing non-vaporous components is a combination of the filters indicated above as "baffle" and "foam combination system" (as in FIG. 10).

The carbon foam material used in the filter devices is a vitreous carbon foam obtained from Goodfellow Holdings Ltd, which has the following specifications: a thickness of 30 mm; a bulk density of 0.05 g cm$^{-3}$; a porosity of 96.5%; a mesh of 24 or 40 pores cm$^{-1}$ (depending on grade); and a temperature resistance of 3000° C. in vacuum or inert gas, or 500-600° C. in air.

The reduction of splashes was determined by analysis of substrate material that has been produced during PVD experiments with any of the above evaporation devices. A representative area of the substrate's surface was photographed, and using optical and lighting arrangement, the specular splash defects can be identified and analyzed using image analysis software.

Splashes are defined as those greater than 50 μm (which is approximately the limit of what the naked eye can observe in normal conditions). It is possible to exploit the difference in reflectivity of splashes and the background using optical microscopy. Image analysis software is available which employs differences in lightness to identify features. Therefore, an image must be produced of a suitably representative area, but having an even lightness across the whole sample, except for the defects in question. This was achieved using a LED light source for imaging, a so called LED dome which enables specular features to be clearly seen. A digital camera was used with an image sensor of 23.5×15.6 mm yielding a resolution of 4912×3264 pixels. The field of view at the highest magnification without using digital zoom at the lens to sample distance of 298 mm is 139×92.5 mm. The resolution that can be achieved is about 26.5 μm per pixel at this distance. This magnification is chosen to encompass a sufficiently large enough area to represent the zone identified. A relative aperture of F/20 was used to maximise the depth of field, the focal length was 50 mm, ISO100 was used to minimise 'graininess', and the exposure time was chosen in the range of $\frac{1}{8}^{th}$-$\frac{1}{15}^{th}$ of a second.

Images are taken with its centre taken at a point 52 cm from the left hand edge of the coated area to incorporate the three splash zones described above.

These photos were then analysed using image analysis software. Firstly, a grey & colour routine was performed, then a detect colour routine, where the threshold limit was manually moved so that erroneous spots are not selected, by optical comparison of the photo against the sample. Any features with a brightness above a particular threshold value are coloured blue and identified for data analysis of size and shape.

The coated area of the substrate used in experiments is 104×17.5 cm, and photographs of dimensions 139×92.5 mm are taken at positions with their centre; 10, 31 & 52 cm respectively from the same coated edge of the substrate sample. These are considered as being representative of the whole surface area, and with the photo at 52 cm being the zone usually exhibiting the most splashes. The experiments were performed at 40 and 80 kW, which refers to the power by the induction heating generator.

Results

Figure 11:
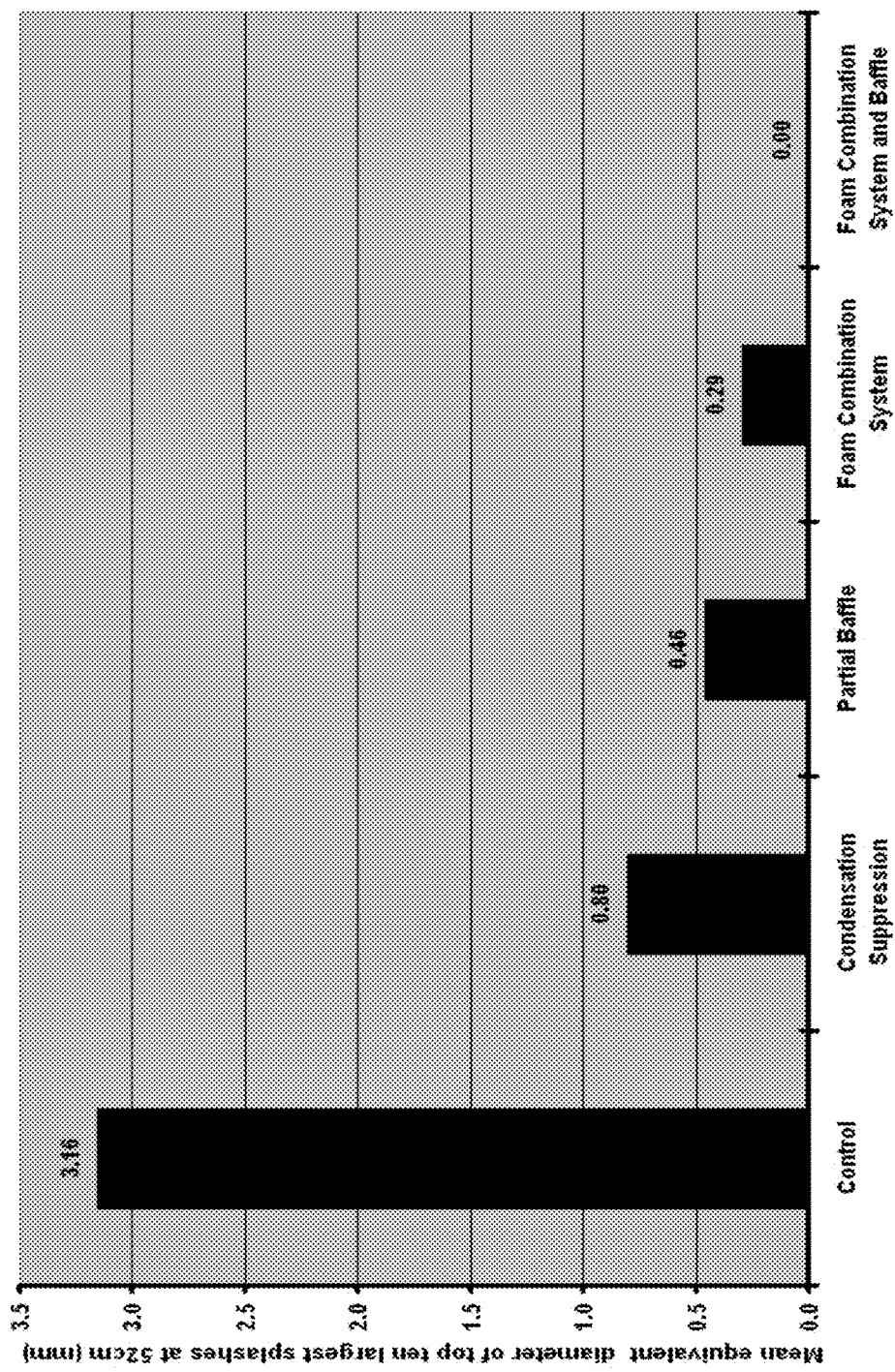
FIG. 11 is a graph showing the effectiveness of an apparatus of the invention in terms of the mean equivalent diameter of the top ten largest splashes.

The mean equivalent diameter of the top ten largest splashes on the coated substrates was measured. FIG. 11 shows the mean equivalent diameter of the ten largest splashes for the photo taken at the 52 cm position for each of the five different filter devices described above.

The successive filter devices traversing to the right across the x-axis demonstrate increasing performance in the splash reduction. The Control (#1) performs worst, while the device with "Foam Combination System and Baffle (#5) is the best embodiment of the invention. The latter even has completely eliminated splashes during the 80 kW experiment at the 52 cm location.

The invention claimed is:

1. A filter device for reducing the amount of non-vaporous components in a vapour stream, comprising:
   means for removing non-vaporous components from the vapour stream;
   an inlet passage for guiding a vapour stream to the means for removing non-vaporous components, said inlet passage comprising a conduit extending to the means for removing non-vaporous components;

an outlet passage for guiding and releasing the vapour stream from the filter device, said outlet passage comprising a conduit extending from the filter device;

wherein the inlet passage is in fluid communication with the means for removing non-vaporous components; and wherein the means for removing non-vaporous components is in fluid communication with the outlet passage; wherein the means for removing non-vaporous components comprises a carbon foam component, which carbon foam component is capable of being penetrated by the vapour stream to allow fully obstructed passage of the vapour stream as it filters through the carbon foam component towards the outlet passage; and the only route for the vapour stream to pass the means for removing non-vaporous components is via penetration of and filtration through the carbon foam component which obstructs all trajectories between the inlet passage and the outlet passage such that all of the vapour stream is forced into contact with the carbon foam component and no vapour flow can pass alongside the means for removing non-vaporous components, wherein the means for removing non-vaporous components comprises a graphite component adhering to the carbon foam component, which is capable of being heated by electromagnetic induction and capable of conducting the heat to the carbon foam component, the filter device further comprising an induction coil located around the graphite component.

2. The filter device according to claim 1, wherein the graphite component is a graphite tube enclosing the carbon foam component, wherein graphite of the graphite tube is not porous.

3. The filter device according to claim 1, wherein the carbon foam component comprises a first carbon foam component and a second carbon foam component;

wherein the means for removing non-vaporous components comprises a first graphite tube of a first diameter and a second graphite tube of a second diameter that is smaller than the first diameter, wherein:

the first graphite tube encloses the first carbon foam component, wherein graphite of the first graphite tube is not porous;

the second graphite tube encloses the second carbon foam component, wherein graphite of the second graphite tube is not porous;

the first carbon foam component is connected to the first graphite tube and to the second graphite tube such that both graphite tubes are substantially in the same direction, wherein each tube has a respective longitudinal axis and the longitudinal axis of the first tube and the longitudinal axis of the second tube deviate less than 20°.

4. The filter device according to claim 1, wherein the carbon foam component comprises a first carbon foam component and a second carbon foam component;

wherein the means for removing non-vaporous components comprises a first graphite tube of a first diameter and a second graphite tube of a second diameter that is smaller than the first diameter, wherein:

the first graphite tube encloses the first carbon foam component, wherein the first graphite is not porous;

the second graphite tube encloses the second carbon foam component;

the first carbon foam component is connected to the first graphite tube and to the second graphite tube such that both graphite tubes are substantially in the same direction, wherein each tube has a respective longitudinal axis and the longitudinal axis of the first tube and the longitudinal axis of the second tube deviate less than 20°.

wherein the second graphite tube comprises a structure of graphite components and carbon foam components in an alternating fashion.

5. The filter device according to claim 4, wherein the alternating components are ring-shaped and together form a layered structure of a tubular shape, which extends substantially parallel to the direction of the vapour stream.

6. The filter device according to claim 1, wherein the means for removing non-vaporous components, comprises a further carbon foam component, which is in series and in fluid communication with carbon foam component.

7. The filter device according to claim 1, wherein the graphite component adhering to carbon foam component is fused thereto by an adhesive to increase the conduction of heat from the graphite component to the carbon foam component.

8. The filter device according to claim 1, wherein the means for removing non-vaporous components, comprises a further carbon foam component, which is in series and in fluid communication with carbon foam component, carbon foam component and further carbon foam component being placed such that the vapour stream first penetrates carbon foam component and thereafter further carbon foam component.

9. The filter device according to claim 1, further comprising vaporization container connected to the inlet passage, wherein the vaporization container includes a means for heating a source material contained in the vaporization container to a temperature at which the source material evaporates and forms the vapour stream.

10. The filter device according to claim 1, wherein the carbon foam is a material with an open cell structure having a mesh size in the range of 20 to 50 pores/cm.

11. A vapour generator comprising a vaporization container for source material;

means for heating the source material to a temperature at which the source material evaporates and forms a vapour stream ;

a filter device according to claim 1;

an outlet passage;

wherein the vaporization container is in fluid communication with the filter device; and wherein the filter device is in fluid communication with the outlet passage of the vapour generator.

12. A method for depositing a vapour on a substrate to form a coating, comprising providing a vapour generator according to claim 11; then placing a source material in the vaporization container; then activating the means for heating the source material to thereby form a vapour stream; then passing the vapour stream through the carbon foam component of the means for removing non-vaporous components to form a vapour stream substantially free of non-vaporous components; then releasing the vapour stream through outlet passage and spraying the vapour stream onto the substrate to form the coating.

13. The method according to claim 12, wherein the source material comprises a metal.

14. The method of claim 13, further comprising providing a pressure in the vapour generator of less than atmospheric at 760 Torr.

15. The method according to claim 12, further comprising providing a pressure in the vapour generator of less than atmospheric at 760 Torr.

16. The method according to claim 12, wherein the carbon foam component in a filter device of a vapor generator reduces the number of splashes formed when spraying the vapour from the vapor generator on the substrate.

17. The method according to claim 12, wherein the filter device of the vapor generator further comprises an induction coil located around the graphite component, comprising:
   activating the means for heating the source material to thereby form a vapour stream;
   and activating the induction coil around the graphite component; then
   passing the vapour stream through the carbon foam component of the means for removing non-vaporous components to form a vapour stream substantially free of non-vaporous components.

18. The method according to claim 12, wherein the source material comprises a metal selected from the group of zinc, magnesium, titanium, chromium, manganese, nickel, bismuth, strontium, antimony and aluminum.

* * * * *

UNITED STATES PATENT AND TRADEMARK OFFICE
CERTIFICATE OF CORRECTION

PATENT NO. : 10,941,482 B2
APPLICATION NO. : 15/537275
DATED : March 9, 2021
INVENTOR(S) : Daniel Burton et al.

Page 1 of 1

It is certified that error appears in the above-identified patent and that said Letters Patent is hereby corrected as shown below:

In the Claims

In Column 14, Line 9 should read: "dinal axis of the second tube deviate less than 20°,"

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*